NOISE-ELIMINATING BALANCED MODULATOR-MIXER EMPLOYING TWO COMPLEMENTARILY CONTROLLED SWITCHES AND A DIFFERENTIAL AMPLIFIER
Filed March 23, 1965
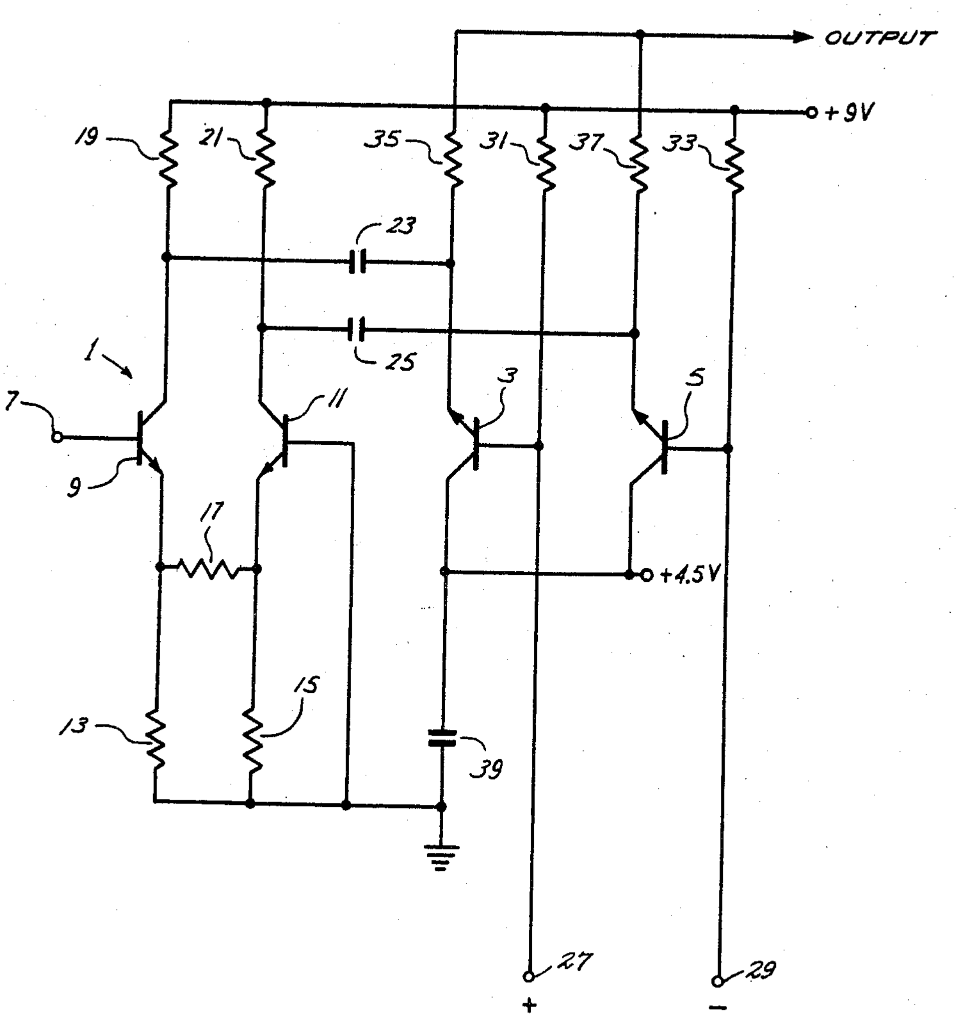
Charles S. Stone
INVENTOR.
BY
Arnold and Roylance
ATTORNEYS United States Patent Office 3,432,759

Patented Mar. 11, 1969

3,432,759

NOISE-ELIMINATING BALANCED MODULATOR-MIXER EMPLOYING TWO COMPLEMENTARILY CONTROLLED SWITCHES AND A DIFFERENTIAL AMPLIFIER

Charles S. Stone, Austin, Tex., assignor to Tracor, Inc., Austin, Tex., a corporation of Texas Filed Mar. 23, 1965, Ser. No. 441,987

U.S. Cl. 325—450 6 Claims

Int. Cl. H04b *1/26;* H03c *1/54*

ABSTRACT OF THE DISCLOSURE

In a balanced modulator-mixer designed to develop an intermediate frequency signal relatively free of noise, differential amplifier means are provided for receiving the input high frequency signal, the oppositely phased outputs of said amplifier are applied respectively to two active element switches which are controlled by complementarily applied switching control signals, and means are provided to sum the chopped outputs from the differential amplifier.

This invention relates to mixers and more particularly to a balanced modulator-mixer electronic circuit, normally of the type that would be used with radio receivers to balance out unwanted frequencies that might stray into the input stages thereof.

A common problem in radio receivers of the heterodyne variety, particularly those receivers that are operating under extremely high noise conditions such as is true occasionally when receiving VLF signal transmissions from stations emanating under very low power conditions, are mixer circuits for establishing intermediate frequencies that are susceptible to interference from stray pickups inside and outside the receiver.

To avoid such stray pickups, various types of balanced modulators have been employed. One of the types that has been employed is the balanced modulator shown in FIG. 3 of Patent 3,163,823. The main disadvantage of this type of modulator-mixer is the employment of a rather expensive and cumbersome transformer. Since transistors of a type that may be employed in a balanced differential amplifier are much cheaper, what is presented herein is an improved modulator-mixer circuit of simplified construction for producing an intermediate frequency output signal from an applied high frequency signal and complementary applied switching control signals.

Generally, the input stage receives the applied high frequency signal and produces two balanced outputs 180° out of phase from each other, such as is accomplished in a differential amplifier. The two outputs are then connected to respective, and closely similar active switching elements, such as triode transistors. Conduction of these active switching elements is controlled by the complementary switching control signals in On-Off fashion, one active element conducting while the other is turned off. Load resistors connected to the respective active elements combine the signals from the active elements during their respective conducting occurrences, thereby producing a single-ended intermediate frequency output at a frequency equal to the frequency of the switching control signals less the frequency of the applied high frequency signal. Noise is greatly attenuated or cancelled in the process.

More particular description of the invention may be had by reference to the embodiments thereof which are illustrated in the appended drawing, which forms a part of this specification. It is to be noted, however, that the appended drawing only illustrates a typical embodiment of the invention and, therefore, is not to be considered limiting of its scope for the invention will admit to other equally effective embodiments.

The drawing is a schematic diagram of one embodiment showing the invention.

Referring to the drawing, an overall circuit is shown comprising generally a differential amplifier 1 and a pair of transistor switches 3 and 5, which together establish from an input high frequency signal (which may be on the order of 20 kc.), and a control signal (which may be on the order of 120 kc.), an output intermediate frequency signal, which would be for the assumed inputs, 100 kc.

Input terminal 7 connected to the differential amplifier 1 applies the input signal, normally from the input stages of a radio receiver, to the base of one of the transistors in the differential amplifier pair, in this instance to the base of transistor 9. Transistor 9 is conventionally connected as a transistor differential amplifier with transistor 11 by an associated resistor network comprising resistors 13, 15, 17, 19 and 21. NPN transistors, such as type 2N1304, are shown for illustrative purposes. It should be understood, however, that the circuit may operate with equal efficiency with PNP-type transistors, provided that the proper biasing connections are made.

The emitters of transistors 9 and 11 are isolated from one another by a small resistor 17 on the order of 82 ohms, which may be used as a fine balancing control to insure that the outputs from the differential amplifier are accurately a balanced output of the base-to-emitter voltage applied to transistor 9.

Resistors 13 and 15, connected respectively between the emitters of transistor 9 and 11 and ground, merely keep the operation of the transistor pair well above the ground operating level, and may each be on the order of 2.2K ohms.

Resistors 19 and 21, respectively connected to the collectors of transistors 9 and 11, provide the necessary bias voltage connections to a positive bias source, which may be on the order of +9 volts. Values that have been used for resistors 19 and 21 have been 909 and 1000 ohms, respectively.

The outputs from the differential amplifier 1 are taken from the collector circuits via capacitors 23 and 25 for transistors 9 and 11, respectively. As a result of the differential amplifier action, the outputs are out of phase from one another by 180 degrees and are of equal amplitude, since the amplifier is balanced.

The output from transistor 9 is applied to the emitter of switching transistor 3 via capacitor 23 and the output from transistor 11 is applied to the emitter of transistor 5 via capacitor 25. These capacitors are typically on the order of 0.1 micromicrofarad. Transistors 3 and 5 may be of the 2N1995 type.

The control voltage, or switching voltage, is applied to the transistors 3 and 5 via terminals 27 and 29, connected respectively to the bases of transistors 3 and 5. Typically the inputs to terminals 27 and 29 are the complementary outputs from a bistable multivibrator driven from a local oscillator stage within the receiver, such that one signal is positive while the other signal is negative in square-wave fashion.

The signal frequency applied to terminals 27 and 29 is normally of a considerably higher frequency than that applied to the emitters of transistors 3 and 5. For instance, assuming that the signal frequency applied via capacitors 23 and 25 to the emitters of transistors 3 and 5 is on the order of 20 kc., then the control voltage frequency applied to terminals 27 and 29 may be on the order of 120 kc.

The amplitude of the voltage applied to terminals 27 and 29 is quite large so that transistors 3 and 5 are driven o conduction very rapidly, much like turning on a switch. That is, the transistors during operation go from a condition of non-conduction to a state of conduction in an On-Off fashion, the On cycle being normally of substantially the same duration as the Off cycle when the bistable multivibrator is used, as pointed out above.

A bias voltage that is more negative than the bias voltage applied to the bases of transistors 3 and 5 is applied directly to the collectors. The bias voltage shown in FIG. 1 is on the order of +4.5 volts, whereas the voltage applied to the bases of transistors 3 and 5 through bias resistors 31 and 33 connected thereto is on the order of +9 volts. These resistors may be on the order of 1.78K ohms.

Load summing resistors 35 and 37, which may be 1.47K ohms, are connected respectively in the emitter circuits of transistors 3 and 5. On the opposite side from the emitters, the lines leading from the resistors are joined to form an output from the circuit that is single ended.

Capacitor 39 in the common collector circuit of transistors 3 and 5 shunts high frequency noise, such as switching noise, to ground. A value of 100 microfarads has been found acceptable for this purpose.

In operation, the On-Off switching action of transistors 3 and 5 may be thought of as achieving a chopper action, causing output phase inversions of the signals applied to the emitters of transistors 3 and 5. The resulting output from the single-ended configuration is a signal at a frequency of the control signal applied at terminals 27 and 29 less the frequency of the applied signal through capacitors 23 and 25. For the frequencies that have been assumed above, it may be seen that the resulting frequency from the modulator-mixer will be 120 kc.−20 kc.=100 kc.

Although the above discussion has been made with respect to a modulator-mixer, it is apparent that the principles apply equally to a demodulator-mixer operating under similar conditions.

While only one embodiment of the invention has been described, it is obvious that various substitutes or modifications of structure may be made without varying from the scope of the invention.

What is claimed is:

1. A balanced modulator-mixer for producing an intermediate frequency output signal from an applied high frequency signal and complementary first and second applied switching control signals, comprising:

a differential amplifier including a first amplier and a second amplier having balanced first and second amplifier outputs separated by 180°, a first active element connected to the first amplifier output, a second active element connected to the second amplifier output, the conduction of said first active element controlled by the first applied switching control signal, the conduction of said second active element controlled by the second applied switching control signal, so that said second active element is conductive while said first active element is non-conductive, a first load resistor connected to the output of said first active element for establishing a voltage during the conduction of said first active element, and a second load resistor connected to the output of said second active element for establishing a voltage during the conduction of said second active element, said first and second load resistors joined at their outputs for producing a single-ended intermediate frequency output.

2. A balanced modulator-mixer in accordance with claim 1, wherein said first and second active elements are transistors.

3. In combination with a balanced differential amplifier having first and second baanced outputs, and a cyclically applied switching signal, a balanced modulator-mixer for producing a single-ended intermediate frequency signal, comprising:

first and second transistor switches connected to receive respectively the first and second balanced outputs from the balanced differential amplifier, conduction of said first and second switches being controlled by the alternate cycles from the applied switching signal so that the output of said first transistor switch is 180° out of phase with said second transistor switch, and first and second summing resistors each having one side connected respectively to a output of said first and second transistor switches, their other ends being joined together, thereby producing a single-ended intermediate frequency output.

4. A balanced modulator-mixer for producing an intermediate frequency output signal from an applied high frequency signal and complementary first and second applied switching control signals, comprising:

a differential amplifier including a first amplifier and a second amplifier having balanced first and second amplifier outputs separated by 180°, a first active element connected to the first amplifier output, a second active element connected to the second amplifier output, the conduction of said first active element controlled by the first applied switching control signal such that said first active element is conductive for substantially the same duration as it is non-conductive, the applied switching signals being at a substantially higher frequency than the applied high frequency signal, the conduction of said second active element controlled by the second applied switching control signal, the second switching control signal being complementary to the first switching control signal, so that the output of said first active element is 180° out of phase from the output from said second active element, a first load resistor connected to the output of said first active element for establishing a voltage during the conduction of said first active element, and a second load resistor connected to the output of said second active element for establishing a voltage during the conduction of said second active element, said first and second load resistors joined at their outputs, whereby a single-ended intermediate frequency output is produced having a frequency equal to the frequency of the applied first and second switching control signals less the frequency of the applied high frequency signal.

5. A balanced modulator-mixer in accordance with claim 4, wherein said first and second active elements are transistors.

6. A balanced modulator-mixer for producing an intermediate frequency output signal from an applied high frequency signal and complementary first and second applied switching control signals, comprising:

a transistor differential amplifier including a first amplifier and a second amplifier having balanced first and second amplifier outputs separated by 180°, a first transistor triode having a base, emitter and collector, said first triode emitter being connected to the first amplifier output from the differential amplifier, the first applied switching control signal being applied to said first triode base, the applied switching control signals having a substantially higher frequency than the applied high frequency signal, a second transistor triode having a base, emitter and collector, said second triode emitter being connected to the second amplifier output from the differential amplifier, the second applied switching control signal being applied to said first triode base, the second switching control signal being complementary to the first switching control signal, so that the first triode output is 180° out of phase from the second triode output, a first load resistor connected to the collector of said first triode for establishing a voltage during the conduction of said first triode, and a second load resistor connected to the collector of said second triode for establishing a voltage during the conduction of said second triode, said first and second load resistors being joined at their outputs, whereby a single-ended intermediate frequency output is produced having a frequency equal to the frequency of the applied switching control signals less the frequenc of the applied high frequency signal.

References Cited

UNITED STATES PATENTS 3,315,181 4/1967 Rosenthal -------- 332—43 X]

KATHLEEN H. CLAFFY, *Primary Examiner.*

R. S. BELL, *Assistant Examiner.*

U.S. Cl. X.R.

325—439; 332—43